(12) United States Patent  (10) Patent No.: US 9,365,749 B2
Khanna  (45) Date of Patent: Jun. 14, 2016

(54) ANISOTROPIC CONDUCTIVE ADHESIVE WITH REDUCED MIGRATION

(71) Applicant: SunRay Scientific, LLC, Long Branch, NJ (US)

(72) Inventor: S. Kumar Khanna, Carmel, IN (US)

(73) Assignee: Sunray Scientific, LLC, Long Branch, NJ (US)

( * ) Notice: Subject to any disclaimer, the term of this patent is extended or adjusted under 35 U.S.C. 154(b) by 186 days.

(21) Appl. No.: 14/054,529

(22) Filed: Oct. 15, 2013

(65) Prior Publication Data

US 2014/0353540 A1  Dec. 4, 2014

Related U.S. Application Data

(60) Provisional application No. 61/829,365, filed on May 31, 2013.

(51) Int. Cl.
*C09J 9/02* (2006.01)
*C09J 11/00* (2006.01)
(Continued)

(52) U.S. Cl.
CPC .. *C09J 9/02* (2013.01); *C09J 11/00* (2013.01); *H01L 24/16* (2013.01); *H01L 24/29* (2013.01); *H01L 24/32* (2013.01); *H01L 24/33* (2013.01); *H01L 24/75* (2013.01); *H01L 24/83* (2013.01); *H05K 3/323* (2013.01); *C08K 9/08* (2013.01); *H01L 2224/16225* (2013.01); *H01L 2224/16227* (2013.01); *H01L 2224/16505* (2013.01); *H01L 2224/2929* (2013.01); *H01L 2224/2936* (2013.01); *H01L 2224/2949* (2013.01); *H01L 2224/29355* (2013.01); *H01L 2224/29357* (2013.01); *H01L 2224/29387* (2013.01); *H01L 2224/29393* (2013.01); *H01L 2224/29395* (2013.01); *H01L 2224/29439* (2013.01); *H01L 2224/29444* (2013.01); *H01L 2224/29488* (2013.01); *H01L 2224/29493* (2013.01); *H01L 2224/29499* (2013.01); *H01L 2224/3213* (2013.01); *H01L 2224/32058* (2013.01); *H01L 2224/32225* (2013.01);
(Continued)

(58) Field of Classification Search
None
See application file for complete search history.

(56) References Cited

U.S. PATENT DOCUMENTS 4,170,677 A  10/1979  Hutcheson
4,568,592 A  2/1986  Kawaguchi et al.
(Continued)

FOREIGN PATENT DOCUMENTS

WO  2013052129 A1  4/2013

OTHER PUBLICATIONS

"IDEAS Microwave Laboratory: Anisotropic Conductive Adhesives," https://engineering.purdue.edu/IDEAS/ACA.html (2010).
(Continued)

*Primary Examiner* — Harold Pyon
*Assistant Examiner* — Katie L Hammer
(74) *Attorney, Agent, or Firm* — Barnes & Thornburg LLP (57) ABSTRACT

Illustrative embodiments of an anisotropic conductive adhesive (ACA) configured to be cured after being subjected to a magnetic field are disclosed. In at least one illustrative embodiment, the ACA may comprise a binder and a plurality of particles suspended in the binder. Each of the plurality of particles may comprise a ferromagnetic material coated with a layer of electrically conductive material and with a moisture barrier, such that the electrically conducting material forms electrically conductive and isolated parallel paths when the ACA is cured after being subjected to the magnetic field.

19 Claims, 6 Drawing Sheets

(51) Int. Cl.
*H01L 23/00* (2006.01)
*H05K 3/32* (2006.01)
*C08K 9/08* (2006.01)

(52) U.S. Cl.
CPC .............. *H01L 2224/33181* (2013.01); *H01L 2224/33183* (2013.01); *H01L 2224/73204* (2013.01); *H01L 2224/75101* (2013.01); *H01L 2224/75264* (2013.01); *H01L 2224/75272* (2013.01); *H01L 2224/75804* (2013.01); *H01L 2224/831* (2013.01); *H01L 2224/83007* (2013.01); *H01L 2224/8321* (2013.01); *H01L 2224/83055* (2013.01); *H01L 2224/83192* (2013.01); *H01L 2224/83851* (2013.01); *H01L 2224/83862* (2013.01); *H01L 2224/83874* (2013.01); *H01L 2224/83887* (2013.01); *H01L 2224/83906* (2013.01); *H01L 2224/83986* (2013.01); *H05K 2203/104* (2013.01)

(56) References Cited

U.S. PATENT DOCUMENTS

| | | | |
|---|---|---|---|
| 4,578,425 A * | 3/1986 | Santorelli | B32B 27/04 156/330 |
| 4,737,112 A * | 4/1988 | Jin | H01L 24/10 257/E21.511 |
| 4,772,422 A | 9/1988 | Hijikata et al. | |
| 4,866,133 A * | 9/1989 | Andrews | C08G 59/18 156/307.1 |
| 4,878,978 A | 11/1989 | Goel et al. | |
| 4,966,729 A | 10/1990 | Carmona et al. | |
| 5,045,249 A | 9/1991 | Jin et al. | |
| 5,132,058 A * | 7/1992 | Suyama | G01R 1/07342 264/104 |
| 5,136,365 A | 8/1992 | Pennisi et al. | |
| 5,162,087 A | 11/1992 | Fukuzawa et al. | |
| 5,169,471 A | 12/1992 | Strasser | |
| 5,209,873 A * | 5/1993 | Yamamoto | H01B 1/22 252/512 |
| 5,221,417 A | 6/1993 | Basavanhally | |
| 5,225,966 A | 7/1993 | Basavanhally et al. | |
| 5,236,631 A | 8/1993 | Osawa | |
| 5,286,417 A | 2/1994 | Mahmoud et al. | |
| 5,330,684 A | 7/1994 | Emori et al. | |
| 5,344,593 A | 9/1994 | Chiba et al. | |
| 5,429,701 A | 7/1995 | Lu | |
| 5,438,223 A | 8/1995 | Higashi et al. | |
| 5,453,148 A | 9/1995 | Lu et al. | |
| 5,522,962 A | 6/1996 | Koskenmaki et al. | |
| 5,624,268 A | 4/1997 | Maeda et al. | |
| 5,648,124 A * | 7/1997 | Sutor | B01J 13/02 427/129 |
| 5,661,042 A | 8/1997 | Fang et al. | |
| 5,769,996 A | 6/1998 | McArdle et al. | |
| 5,785,913 A | 7/1998 | Clark, Jr. et al. | |
| 5,789,278 A | 8/1998 | Akram et al. | |
| 5,840,215 A | 11/1998 | Iyer et al. | |
| 5,851,644 A | 12/1998 | McArdle et al. | |
| 5,891,366 A | 4/1999 | Gruenwald et al. | |
| 5,918,113 A | 6/1999 | Higashi et al. | |
| 5,965,064 A | 10/1999 | Yamada et al. | |
| 6,036,813 A | 3/2000 | Schulz et al. | |
| 6,039,896 A | 3/2000 | Miyamoto et al. | |
| 6,048,599 A | 4/2000 | Chu et al. | |
| 6,107,122 A | 8/2000 | Wood et al. | |
| 6,110,399 A | 8/2000 | McArdle et al. | |
| 6,137,183 A | 10/2000 | Sako | |
| 6,149,857 A | 11/2000 | McArdle et al. | |
| 6,171,107 B1 | 1/2001 | Milne | |
| 6,190,509 B1 | 2/2001 | Haba | |
| 6,238,597 B1 | 5/2001 | Yim et al. | |
| 6,344,156 B1 | 2/2002 | Yamada et al. | |
| 6,352,775 B1 | 3/2002 | Sasaki et al. | |
| 6,355,504 B1 | 3/2002 | Jiang | |
| 6,368,896 B2 | 4/2002 | Farnworth et al. | |
| 6,392,306 B1 | 5/2002 | Khandros et al. | |
| 6,402,876 B1 * | 6/2002 | McArdle | G03F 7/34 156/247 |
| 6,579,744 B1 | 6/2003 | Jiang | |
| 6,592,783 B2 | 7/2003 | Kumakura et al. | |
| 6,733,613 B2 | 5/2004 | Khanna | |
| 6,737,300 B2 | 5/2004 | Ding et al. | |
| 6,741,019 B1 | 5/2004 | Filas et al. | |
| 6,827,880 B2 | 12/2004 | Ishimatsu | |
| 6,838,022 B2 | 1/2005 | Khanna | |
| 6,909,100 B2 | 6/2005 | Sognefest et al. | |
| 7,078,095 B2 | 7/2006 | Tam | |
| 7,294,358 B2 | 11/2007 | Tam | |
| 7,326,633 B2 | 2/2008 | Chen | |
| 7,494,907 B2 | 2/2009 | Brown et al. | |
| 7,799,865 B2 * | 9/2010 | Ledwidge | C09J 4/00 524/556 |
| 8,471,274 B2 | 6/2013 | Golle et al. | |
| 8,754,435 B1 | 6/2014 | Tischler et al. | |
| 8,933,482 B2 | 1/2015 | Miyata | |
| 2002/0014615 A1 | 2/2002 | Yamada et al. | |
| 2004/0016505 A1 | 1/2004 | Khanna | |
| 2004/0161906 A1 | 8/2004 | Khanna | |
| 2005/0218377 A1 * | 10/2005 | Lawandy | B82Y 30/00 252/299.01 |
| 2006/0243972 A1 | 11/2006 | Uang et al. | |
| 2006/0249834 A1 | 11/2006 | Uang et al. | |
| 2006/0280912 A1 | 12/2006 | Liang et al. | |
| 2007/0054984 A1 | 3/2007 | Jun et al. | |
| 2007/0059503 A1 | 3/2007 | Park et al. | |
| 2008/0078977 A1 | 4/2008 | Hashiba et al. | |
| 2009/0140210 A1 | 6/2009 | Toshioka et al. | |
| 2010/0101832 A1 | 4/2010 | Verhaverbeke et al. | |
| 2010/0193748 A1 * | 8/2010 | Hama | C08L 79/08 252/503 |
| 2011/0284262 A1 | 11/2011 | Chappell et al. | |
| 2011/0315956 A1 | 12/2011 | Tischler et al. | |
| 2012/0049100 A1 * | 3/2012 | Yonetsu | B22F 1/0018 252/62.54 |
| 2012/0106111 A1 | 5/2012 | Mazzochette et al. | |
| 2012/0107552 A1 | 5/2012 | Tellkamp | |
| 2012/0175667 A1 | 7/2012 | Golle et al. | |
| 2013/0082298 A1 | 4/2013 | Golle et al. | |
| 2013/0285073 A1 | 10/2013 | Golle et al. | |
| 2015/0021632 A1 | 1/2015 | Taghizadeh et al. | |
| 2015/0107765 A1 | 4/2015 | Khanna | |

OTHER PUBLICATIONS

Sungwook Moon et al., "Magnetically Aligned Anisotropic Conductive Adhesive for Microwave Applications," IEEE Transactions on Microwave Theory & Techniques, Dec. 2008, pp. 2942-2949, vol. 56, No. 12.

Gou-Jen Wang et al., "Ultra Fine Pitch Flat Panel Display Packaging Using 3μm Conductive Particles," DTIP of MEMS & MOEMS, Apr. 26-28, 2006, 5 pages.

Myung Jin Yim et al., "Recent Advances on Anisotropic Conductive Adhesives (ACAs) for Flat Panel Displays and Semiconductor Packaging Applications," International Journal of Adhesion & Adhesives, Jul. 7, 2006, pp. 304-313, vol. 26.

Sungwook Moon et al., "Multilayer Silicon RF System-in-Package Technique Using Magnetically Aligned Anisotropic Conductive Adhesive," IEEE MTTS Int. Microwave Symp., Jun. 2009, 4 pages.

\* cited by examiner

ANISOTROPIC CONDUCTIVE ADHESIVE WITH REDUCED MIGRATION

CROSS REFERENCE TO RELATED APPLICATION

This application claims priority to U.S. Provisional Application Ser. No. 61/829,365, filed May 31, 2013, the entire disclosure of which is incorporated by reference.

BACKGROUND

Anisotropic conductive adhesive ("ACA") may be utilized to form conductive paths between pairs of aligned contacts, such as a contact of an integrated circuit or integrated circuit package and a contact of a substrate (e.g., a printed circuit board). A typical ACA includes conductive particles suspended in a binder. Such an ACA may be interposed in an uncured state between the integrated circuit or integrated circuit package and the substrate, after which the ACA may be cured in the presence of a magnetic field. The conductive particles of the ACA will form conductive paths between contacts of the integrated circuit or integrated circuit package and of the substrate while, at the same time, the ACA bonds the integrated circuit or integrated circuit package to the substrate.

SUMMARY

According to one aspect, an ACA configured to be cured after being subjected to a magnetic field may comprise a binder and a plurality of particles suspended in the binder. Each of the plurality of particles may comprise a ferromagnetic material coated with a layer of electrically conductive material and with a moisture barrier, the electrically conducting material forming electrically conductive and isolated parallel paths when the ACA is cured after being subjected to the magnetic field.

In some embodiments, the moisture barrier may surround the layer of electrically conductive material on each of the plurality of particles prior to the ACA being subjected to the magnetic field. The moisture barrier may surround each of the electrically conductive and isolated parallel paths after the ACA is cured. The ACA may be configured to be cured by a heat treatment. The ACA may be configured to be cured while still being subjected to the magnetic field.

In some embodiments, the moisture barrier may comprise a solution of phenolic novolak in furfural solvent. The solution may comprise between 30-70% phenolic novolak by weight and between 30-70% furfural solvent by weight. The solution may comprise equal parts of the phenolic novolak and the furfural solvent. In other embodiments, the moisture barrier may comprise a carbon layer.

In some embodiments, the electrically conductive material may comprise a noble metal. The ferromagnetic material of each of the plurality of particles may comprise a solid sphere. Each of the plurality of particles further may comprise a core formed from at least one of carbon, graphite, glass, and mica, the core being coated with the ferromagnetic material.

In some embodiments, an average maximum dimension of the plurality of particles may be between 1 μm and 25 μm. The average maximum dimension may be less than 1 μm.

In some embodiments, the binder may be formed from the reaction product of a catalyst and a compound comprising an aromatic epoxy resin, a dimer fatty acid diglycidyl ester, and an oxirane. In other embodiments, the binder may be formed from the reaction product of a phenolic resin, a catalyst, and one of (i) a thermally polymerized aromatic epoxy resin and (ii) a phenoxy modified epoxy novalac resin.

According to another aspect, a method may comprise coating each of a plurality of particles including a ferromagnetic material with a layer of electrically conductive material, applying a chemical modifier to the plurality of particles to form a moisture barrier around the layer of electrically conductive material of each of the plurality of particles, and dispersing the plurality of particles in a binder to form an ACA.

In some embodiments, the method may further comprise subjecting the ACA to a magnetic field, such that the electrically conducting material forms electrically conductive and isolated parallel paths, and curing the ACA. Applying the chemical modifier to the plurality of particles may comprise applying a solution of phenolic novolak in furfural solvent to the plurality of particles. An average maximum dimension of the plurality of particles may be between 1 μm and 25 μm.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the present disclosure.

It should also be understood that any numerical range recited herein is intended to include all sub-ranges subsumed therein. For example, a range of "1 to 10" is intended to include all sub-ranges between and including the recited minimum value of 1 and the recited maximum value of 10, i.e., having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

As used in the present disclosure, the term "polymer" encompasses oligomers and includes, without limitation, both homopolymers and copolymers. As used herein, "(meth) acrylate" and like terms are intended to include both acrylates and methacrylates. As used herein, the term "aryl" refers to aromatic groups that include, without limitation, phenyl, biphenyl, benzyl, xylyl, napthalenyl, anthracenyl, and the like, as well as heterocyclic aromatic groups that include, without limitation, pyridinyl, pyrrolyl, furanyl, thiophenyl, and the like.

The present disclosure relates to an anisotropic conductive adhesive ("ACA") with reduced migration of the electrically conductive material of particles of the ACA. The presently disclosed ACA has been found to be particularly suitable for use in forming conductive paths between conductive contacts of an integrated circuit or integrated circuit package and conductive contacts on a substrate that are aligned with the conductive contacts on the integrated circuit or integrated circuit package, while avoiding electrical shorting between adjacent conductive paths. The ACA is particularly suitable for creating isolated, parallel conductive paths between contacts of an integrated circuit and contacts of a substrate having an edge-to-edge spacing less than 250 µm, including spacing as small as about 20 µm to 25 µm.

Figure 1:
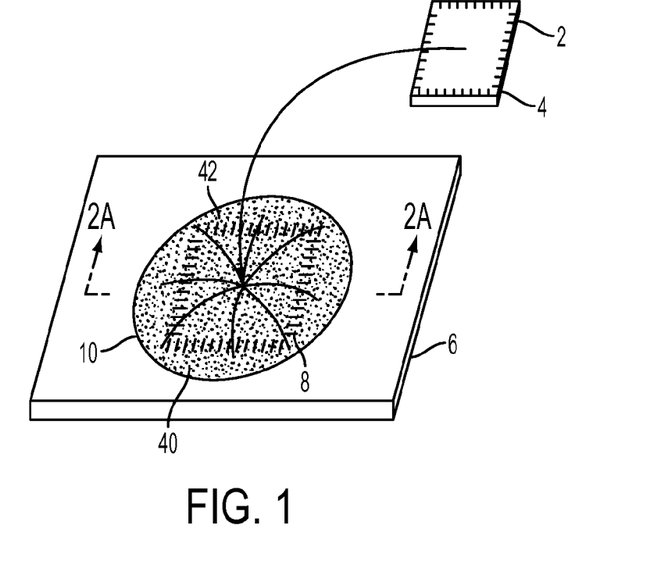
FIG. 1 is a perspective view of one illustrative embodiment of the positioning of an integrated circuit package on an ACA deposited on a substrate.

With reference to FIG. 1, an integrated circuit package 2 includes a plurality of closely spaced contacts positioned on or adjacent the edges of package 2. In FIG. 1, package 2 is illustrated as a leadless chip carrier package. However, in other embodiments, the presently disclosed ACA may be used with other surface mount integrated circuit packages, such as ball grid arrays, dual inline or quad packages having gull-wing or j-shaped leads, and quad flat packs having laterally extending leads, or any other form of integrated circuit package having closely spaced leads. In addition, it is also contemplated that the presently disclosed ACA may be used with unpackaged integrated circuits for flip-chip mounting thereof. As shown in FIG. 1, package 2 is received on a substrate 6 having a plurality of closely spaced contacts 8 disposed in mirror image relation to the contacts 4 of package 2. Prior to mounting package 2 on substrate 6, a drop or coating of uncured ACA 10 is deposited on substrate 6 over the plurality of contacts 8.

Figure 2A:
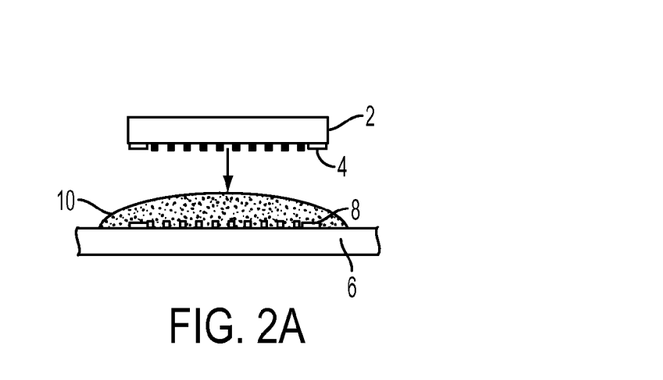
FIG. 2A is a cross-sectional view of the integrated circuit package in spaced relation to the substrate and the ACA taken along section lines 2A-2A in FIG. 1.
Figure 2B:
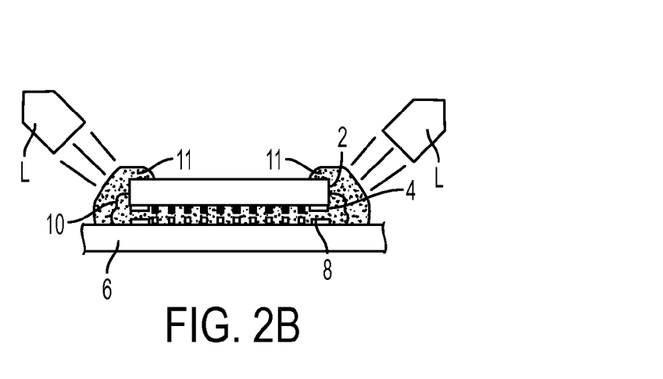
FIG. 2B is a cross-sectional view of the integrated circuit package in contact with the ACA deposited on the substrate, from the same viewpoint as FIG. 2A.

Referring now to FIGS. 2A and 2B, package 2 is positioned with its contacts 4 in opposition to the contacts 8 of substrate 6. More specifically, each contact 4 of package 2 is positioned in alignment with a corresponding contact 8 of substrate 6. Thereafter, as shown in FIG. 2B, package 2 is moved into contact with ACA 10. In response to this contact, ACA 10 displaces somewhat. However, the viscosity of ACA 10 is such that contacts 4 of package 2 and contacts 8 of substrate 6 are maintained in spaced relation by ACA 10. In other words, package 2 is moved into contact with ACA 10 such that contacts 4 of package 2 and contacts 8 of substrate 6 are not in physical contact with each other. Furthermore, the displacement of ACA 10 is due primarily to the weight of package 2, and only slightly due to the force utilized to move package 2 into contact with ACA 10.

After package 2 is deposited on ACA 10 with each contact 4 in alignment with a corresponding contact 8 of substrate 6, an adhesive 11 may be used to secure the relative position of package 2 and substrate 6. For instance, a UV curable adhesive 11 may be deposited around the perimeter of package 2. In other embodiments, UV curable adhesive 11 may be deposited on only two or more corners of package 2. After UV curable adhesive 11 has been deposited, it may be exposed to UV light from one or more light sources L for a sufficient interval to cause UV curable adhesive 11 to commence curing (without exposing it and ACA 10 to an elevated curing temperature). If ACA 10 includes a UV curable component, exposure to the UV light from the one or more light sources L may also cause this component of ACA 10 to commence curing. In some embodiments, instead of using UV curable adhesive 11, another form of adhesive that can be cured independent of ACA 10 may be utilized. It will be appreciated that the use of adhesive 11 to secure the relative position of package 2 and substrate 6 prior to curing of ACA 10 is optional and may not be desirable or needed in some embodiments.

Figure 3:
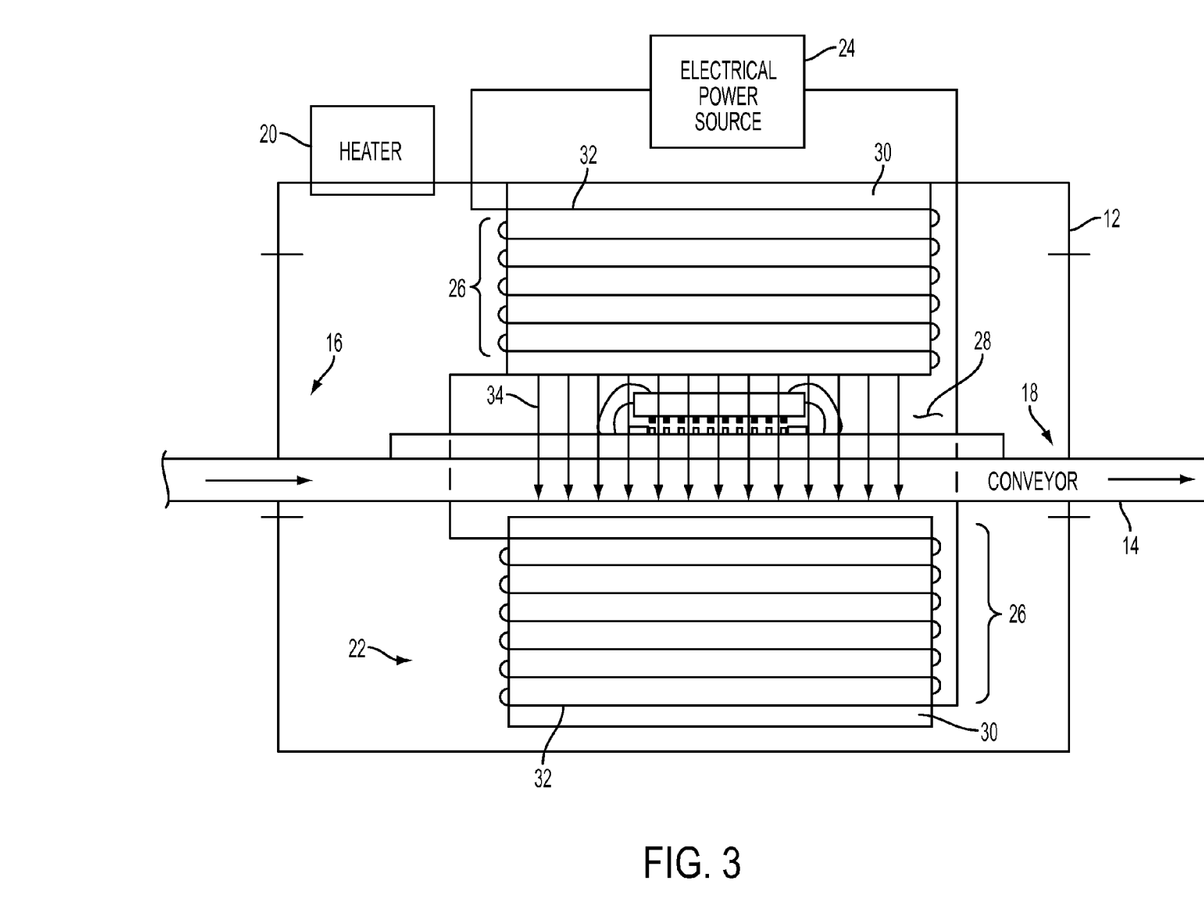
FIG. 3 is a schematic representation of one illustrative embodiment of a curing oven having a magnetic field generator.

With reference to FIG. 3, after adhesive 11 has cured, the entire assembly (i.e., package 2, substrate 6, and ACA 10) is positioned in a curing oven 12. In a production environment, curing oven 12 can have a conveyor 14 which extends through curing oven 12 between an inlet 16 and outlet 18 thereof for transporting the assembly. Curing oven 12 may be embodied as an enclosure of any suitable shape and size in which the assembly can be positioned. In the illustrative embodiment, curing oven 12 includes a heater 20 for heating the atmosphere (e.g., air) inside of curing oven 12.

Curing oven 12 also includes a magnetic field generator 22 disposed therein which is coupled to and controlled by an electrical power source 24 disposed external to curing oven 12. Magnetic field generator 22 includes a pair of poles 26 disposed in spaced relation across a gap 28 in which package 2 received on ACA 10 deposited on substrate 6 is positioned in or passes through on conveyor 14. Each pole 26 includes a pole element 30 of ferromagnetic or paramagnetic material having one or more windings 32 of wire (or other suitable conductive material). Windings 32 are electrically insulated from pole elements 30 by a suitable insulator on pole elements 30 and/or a suitable insulator around the wire forming windings 32. Windings 32 of each pole 26 are connected to each other and to electrical power source 24 such that, in response to electrical power source 24 supplying windings 32 with a suitable electrical current, a magnetic field 34 is generated across gap 28.

In the illustrative embodiment of FIG. 3, poles 26 are configured so that magnetic field 34 is highly homogeneous, at least where package 2 received on ACA 10 deposited on substrate 6 is positioned in curing oven 12 during curing of ACA 10. In the illustrative embodiment, magnetic field 34 has a homogeneity of greater than 98.5%. In other embodiments, magnetic field 34 may have other levels of homogeneity (e.g., 95%).

Figure 4:
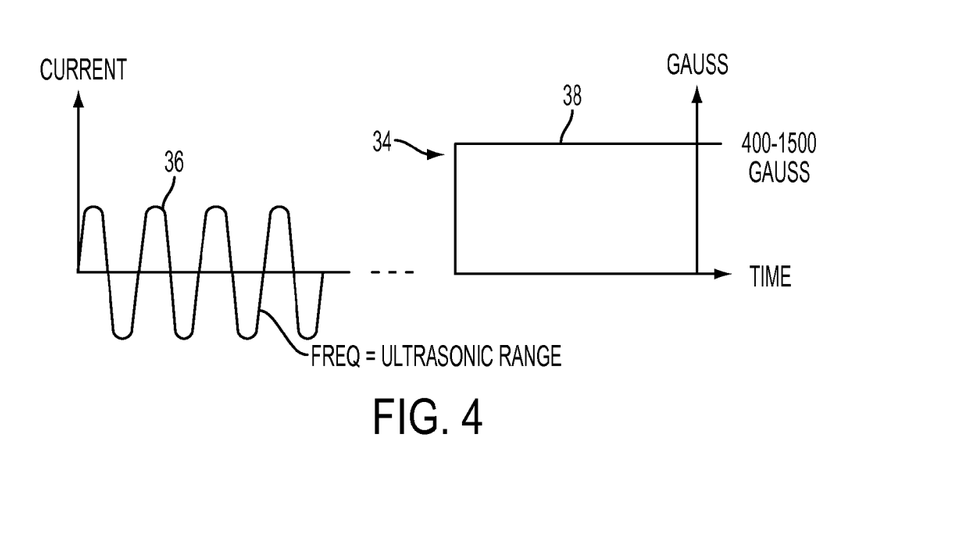
FIG. 4 includes a plot of current versus time that may be used to drive the magnetic field generator of FIG. 3, as well as field strength versus time for the resulting magnetic field.

Referring now to FIG. 4, electrical power source 24 may initially apply an alternating current signal 36 to windings 32 for a time period (e.g., between 15 and 30 seconds), followed by a direct current signal 38 for the remainder of the curing time of ACA 10. The amplitude of the alternating current signal 36 may be selected based on the sizes of particles (discussed below) included in ACA 10. By way of example, the amplitude of alternating current signal 36 may be selected so that magnetic field 34 has an alternating magnetic field strength between 10 and 100 gauss. The value of direct current signal 38 may be selected so that magnetic field 34 has a static magnetic field strength between 400 and 1,500 gauss.

Magnetic field 34 shown in FIG. 3 includes the alternating magnetic field produced by magnetic field generator 22 in response to alternating current signal 36 and the static magnetic field produced by magnetic field generator 22 in response to direct current signal 38. It has been observed that alternating current signal 36 operating in the ultrasonic frequency range (e.g., between about 20 kHz and about 500 kHz) works well with ACA 10. However, in other embodiments, other frequencies outside of the ultrasonic frequency range can also be utilized.

Curing oven 12 is heated, or preheated, to a suitable curing temperature for ACA 10. In the illustrative embodiment, ACA 10 is subjected to this curing temperature for a suitable curing interval while being subjected to magnetic field 34. In other embodiments, ACA 10 may be cured within a short time (e.g., one minute or less) after being subjected to magnetic field 34. The curing temperature and the curing interval of ACA 10 may vary between 70° C. for about 30 minutes to 150° C. for about 5-7 minutes.

Figure 5:
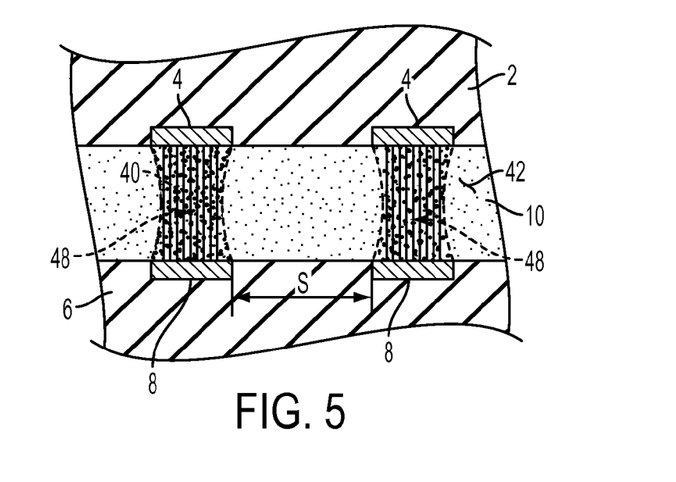
FIG. 5 is an isolated diagrammatic cross-section of one illustrative embodiment of a pair of isolated, parallel conductive paths in a cured ACA.

With reference to FIG. 5, once cured to a solid, ACA 10 forms conductive paths between each contact 4 of package 2 and each corresponding contact 8 of substrate 6 in alignment therewith. It has been observed that the presently disclosed ACA 10 can form electrically conductive, but isolated, parallel conductive paths 48 between adjacent pairs of aligned contacts having an edge-to-edge spacing S as small as 20-25 µm.

As shown in FIG. 1, ACA 10 includes a plurality of particles 40 suspended in a binder 42. Each of particles 40 may include a ferromagnetic material (e.g., nickel, iron, cobalt, or the like) coated with a layer of electrically conductive material, such as a noble metal (e.g., gold, silver, or the like). By way of example, particles 40 may include one or more of the following: solid nickel coated spheres, solid nickel flakes, solid carbon/graphite spheres, solid glass spheres, solid mica particles or flakes, and hollow glass spheres. As used herein, the terms "sphere" or "spheres" generally refers to particles are ball-shaped, egg-shaped or minor variations of ball-shaped and egg-shaped. Particles 40 that include a solid carbon/graphite sphere, a solid glass sphere, a solid mica particle or flake, or a hollow glass sphere may each include a coating of ferromagnetic material (e.g., nickel) between the outside surface of the sphere and the coating of electrically conductive material. The coating of ferromagnetic material on these otherwise non-magnetic materials renders them susceptible to the influence of magnetic field 34.

In the illustrative embodiment, each particle 40 along with the one or more coatings thereon has a maximum dimension less than 100 µm. In some embodiments, each particle 40 along with the one or more coatings thereon may have a maximum dimension less than 25 µm. In still embodiments, each particle 40 along with the one or more coatings thereon may have a maximum dimension less than 1 µm. As used herein, the term "maximum dimension" means the largest dimension of the particle measured in any direction. For example, if a particle 40 is a sphere, the maximum dimension is the outside diameter of the electrically conductive material deposited on the sphere. If the particle 40 is a flake having an irregular shape, the maximum dimension is the dimension between the two points of the electrically conductive material deposited over the particle 40 that are farthest apart.

It has been observed that particles 40 having an average maximum dimension between 1 µm and 25 µm enable the formation of isolated, parallel conductive paths between adjacent pairs of aligned contacts having an edge-to-edge spacing as close as 20-25 µm. It will be appreciated a plurality of particles having this average maximum dimension will have some particles having less than 1 µm (e.g., submicron) and some particles having a maximum dimension greater than 25 µm. To this end, it has been observed that in a population of particles 40 with an average maximum dimension between 1 µm and 25 µm, some of the particles can have a maximum dimension in the submicron range.

One illustrative embodiment of ACA 10 includes a binder 42 formed from the reaction product of between 82% and 91% by weight of a compound and no more than about 6% by weight of a catalyst. The compound includes about one-third by weight of each of an aromatic epoxy resin, a dimer fatty acid diglycidyl ester, and an oxirane. Any suitable aromatic epoxy resin may be used in the compound. Suitable aromatic epoxy resins include, but are not limited to, diglycidyl ethers of bisphenol-A and bisphenol-F and other such resins, such as those available from EPON Resins from Resolution Performance Products, Houston, Tex. Any suitable dimer fatty acid diglycidyl ester may be used in the compound. Suitable dimer fatty acid diglycidyl esters include, but are not limited to, those of the formula:

where $R^1$ is $C_1$-$C_{20}$ alkylene, arylene, or alkarylene. Any suitable oxirane may be used in the compound. Suitable oxiranes include, but are not limited to, those of the formula:

where $R^2$ is linear or branched $C_1$-$C_{20}$, alkyl, aryl, alkaryl, or is derived from a poly ether of the formula:

where $R^3$ is a linear or branched $C_1$-$C_{12}$ alkylene and $R^4$ is a linear or branched $C_1$-$C_{20}$ alkyl, aryl or alkaryl group, and "n" is an integer from 1 to 100. In some embodiments, the oxirane may be (butoxy methyl)-butyl glycidyl ether. The aromatic epoxy resin may be the reaction product of about one-half by weight of each of bisphenol-A and epichlorohydrin. The catalyst may include a quaternary cyanyl R-substituted amine. The R group in the quaternary cyanyl R-substituted amine may be a $C_1$-$C_{20}$ linear or branched alkyl, aryl, or aralkyl group. In this illustrative embodiment, particles 40 (including solid nickel spheres coated with silver and/or solid nickel flakes coated with silver) may comprise between 5% and 14% of ACA 10 by weight.

Another illustrative embodiment of ACA 10 includes the same particles 40 and a similar binder 42 to the illustrative embodiment of ACA 10 just described, except that binder 42 includes about 10% by weight of a UV curable modifier which replaces a corresponding weight percentage of the compound. More specifically, binder 42 in this illustrative embodiment of ACA 10 is formed from the reaction product of the UV curable modifier, the catalyst, and the above described compound. One exemplary UV curable modifier is formed from the reaction product of between 8% and 12% by weight of a (meth)acrylate ester, between 76% and 84% by weight of (meth)acrylated urethane, and between 4% and 5% by weight of a hydroxy alkyl aryl ketone. Any suitable (meth) acrylate ester may be used in the UV curable modifier. Suitable (meth)acrylate esters include, but are not limited to, those of the formula of:

where $R^5$ is H or methyl and $R^6$ is a linear, branched, or cyclic $C_1$-$C_{20}$ alkyl, aryl, alkaryl, or aralkyl group. In one embodiment, the (meth)acrylate ester is isobutyl(meth)acrylate. Any suitable hydroxy alkyl aryl ketone may be used in the UV curable modifier. Suitable hydroxy alkyl aryl ketones include, but are not limited to, those of the formula:

where $R^7$ is a linear, branched, or cyclic $C_2$-$C_{20}$ alkyl group containing at least one hydroxyl group and $R^8$ is a $C_6$-$C_{20}$ aryl, alkaryl, or aralkyl group. In an embodiment, the hydroxy alkyl aryl ketone is 1-hydroxy cyclohexyl phenyl ketone.

Another illustrative embodiment of ACA 10 includes binder 42 formed from the reaction product of between 8% and 12% by weight of the compound described above, between 71% and 79% of a phenolic resin, no more than about 6% by weight of a catalyst, such as a quaternary cyanyl R-substituted amine, and no more than about 12% by weight of the UV modifier system. Any suitable phenolic resin may be used. Suitable phenolic resins include, but are not limited to, novalac resins and revol resins. In an embodiment of the invention, the phenolic resin is a novalac resin formed as the reaction product of formaldehyde and one or more of phenol, cresol, bisphenol-A and bisphenol-F. The quaternary cyanyl R-substituted amine may be as described above. This binder 42 may be mixed with about 14% by weight of particles 40 to form ACA 10. In this embodiment, particles 40 are solid nickel spheres coated with gold.

Another illustrative embodiment of ACA 10 includes binder 42 formed from the reaction product of between 71% and 79% by weight of phenolic resin, as described above, 8% to 12% by weight of a thermally polymerized aromatic epoxy resin and no more than about 6% by weight of a catalyst, such as quaternary cyanyl R-substituted amine as described above. The particles 40 added to this binder 42 to form ACA 10 include about 10% by weight of solid carbon/graphite spheres having a coating of gold over a coating of nickel and about 4% by weight of solid glass spheres having a coating of gold over a coating of nickel.

Another illustrative embodiment of ACA 10 includes binder 42 formed from the reaction product of between 71% and 79% by weight of a phenolic resin, as described above, 8% to 12% by weight of a phenoxy modified epoxy novalac resin and no more than about 6% by weight of a catalyst, such as quaternary cyanyl R-substituted amine as described above. The particles 40 added to this binder 42 to form ACA 10 include about 10% by weight of solid carbon/graphite spheres having a coating of gold over a coating of nickel and about 4% by weight of solid glass spheres having a coating of gold over a coating of nickel.

The foregoing embodiments of ACA 10 have a viscosity between 30,000 centi-poise and 45,000 centi-poise at 25° C. and a viscosity of less than 50 centi-poise between 75° C. and 150° C. This change in viscosity in combination with the exposure of ACA 10 to a suitable curing temperature in the presence of magnetic field 34 enables the particles 40 suspended in binder 42 to align under the influence of magnetic field 34 to form adjacent, but electrically isolated, parallel conductive paths between adjacent pairs of aligned contacts having an edge-to-edge spacing as close as 20-25 µm. The isolation of these adjacent parallel isolating conductive paths was confirmed by electrical measurement thereof.

Particles 40 formed from solid mica particles or flakes and/or hollow glass spheres having a coating of noble metal, such as gold or silver, over a coating of nickel may reduce the edge-to-edge spacing of the parallel conductive paths (as compared to the edge-to-edge spacing realized utilizing similarly sized solid nickel spheres coated with a coating of noble metal, solid carbon/graphite spheres having a coating of noble metal over a coating of nickel, and/or solid glass spheres having a coating of noble metal over a coating of nickel). It is believed that the lower weight of the particles 40 formed from solid mica particles or flakes and/or the hollow glass spheres enables them to move more readily under the influence of magnetic field 34 before binder 42 hardens sufficiently to prevent their movement. Furthermore, smaller sizes of particles 40 enable isolated, parallel conductive paths to be formed between adjacent pairs of aligned contacts having a closer edge-to-edge spacing than larger-size particles 40.

Figure 6:
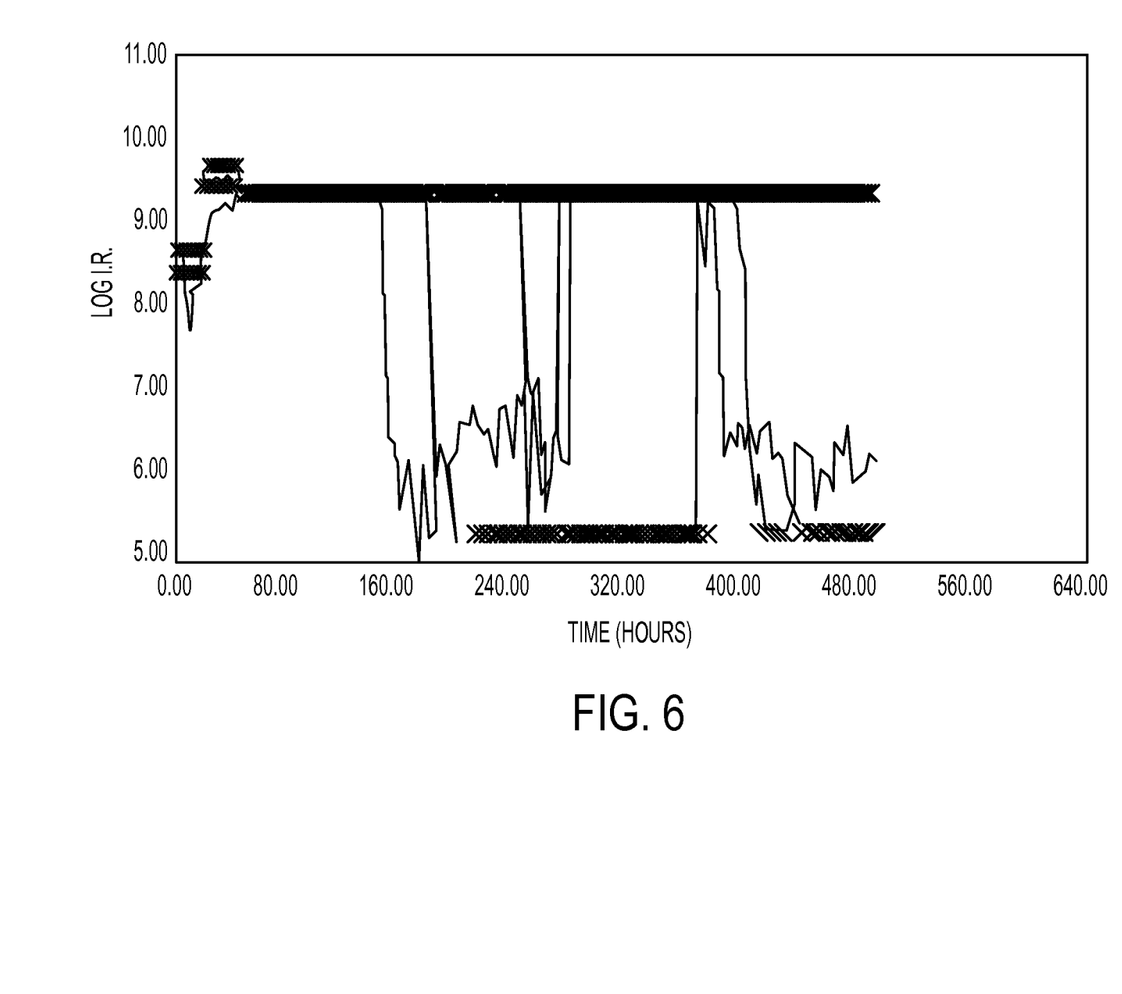
FIG. 6 is a plot of insulation resistance versus time for one illustrative embodiment of an ACA, showing effects of the migration of the electrically conductive material of particles of the ACA.

Over time, particularly in the presence of moisture, the electrically conductive material coating each of particles 40 may begin to migrate through binder 42 of cured ACA 10. This migration of the electrically conductive material of particles 40 may have the adverse effects of breaking electrical contact between aligned contacts 4, 8 of package 2 and substrate 6 and/or of shorting unaligned contacts 4, 8 of package 2 and substrate 6 (i.e., the migration of the electrically conductive material over time may cause the parallel conductive paths to no longer be electrically isolated from one another). By way of example, FIG. 6 illustrates a plot of insulation resistance (I.R.), at 50 V bias, for one illustrative embodiment of ACA 10 over approximately 500 hours, where the ACA 10 was subjected to 80° C. and 80% relative humidity. As can be seen from FIG. 6, the insulation resistance of ACA 10 drops over time; this is believed to be due primarily to migration of the electrically conductive material of particles 40 within ACA 10.

To reduce migration of the electrically conductive material of particles 40, illustrative embodiments of ACA 10 may additionally include a moisture barrier 41 applied to each particle 40. For instance, a chemical modifier may be applied to particles 40, before particles 40 are dispersed in binder 42. High-speed mixing may be used to coat each particle 40 with the chemical modifier to provide moisture barrier 41 outside the layer of electrically conductive material of each particle 40. In one illustrative embodiment, the chemical modifier used to provide moisture barrier 41 may be a mix of phenolic novolak in furfural solvent. It is contemplated that this chemical modifier may be 30-70% phenolic novolak by weight and 30-70% furfural solvent by weight. For instance, in one embodiment, the chemical modifier is a 50:50 mix of phenolic novolak and furfural solvent. In other embodiments, moisture barrier 41 may be formed of a carbon layer, which may increase resistance of particles 40 but has the advantage of better bio-compatibility.

Figure 7A:
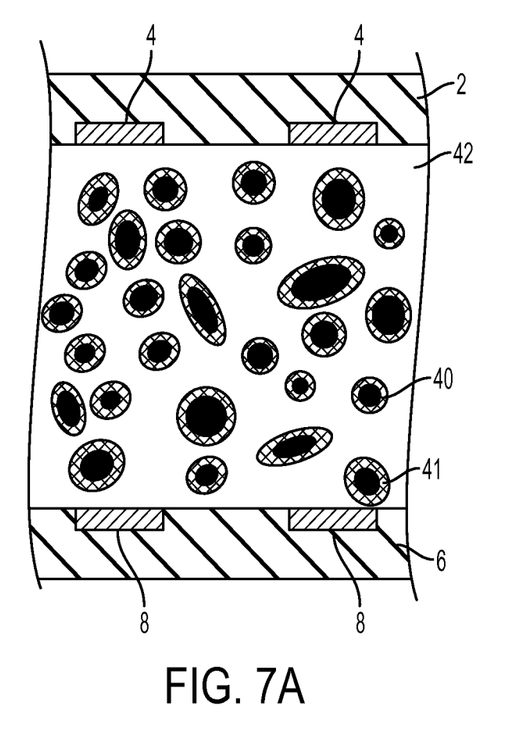
FIG. 7A is an isolated diagrammatic cross-section of one illustrative embodiment of an uncured ACA, showing a random distribution of particles in the binder prior to being subjected to a magnetic field.
Figure 7B:
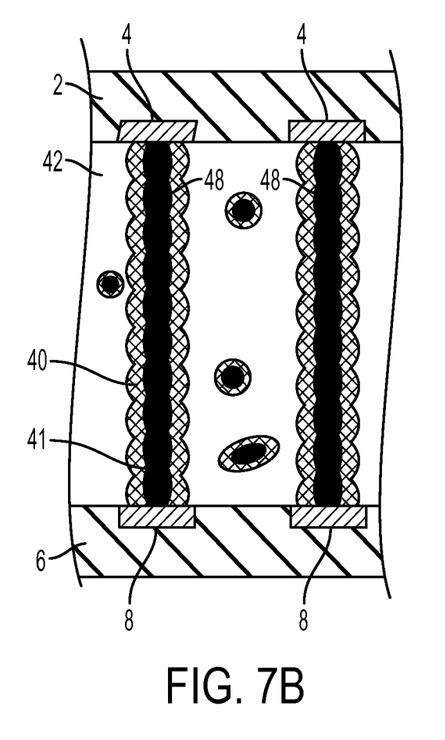
FIG. 7B is an isolated diagrammatic cross-section of the ACA of FIG. 6A, showing an ordered distribution of particles in the binder after being subjected to the magnetic field.

Referring now to FIG. 7A, one illustrative embodiment of ACA 10 including a moisture barrier 41 applied to each particle 40 is shown in diagrammatic cross-section. ACA 10 is disposed between package 2 and substrate 6 (including the aligned contacts 4, 8 thereof), as described above. Prior to ACA 10 being subjected to magnetic field 34, particles 40 are randomly distributed in binder 42. As shown in FIG. 7A, each particle 40 is individually surrounded by a moisture barrier 41. Upon application of magnetic field 34, particles 40 form parallel conductive paths 48 between pairs of aligned contacts 4, 8, as shown in FIG. 7B. As particles 40 align to form parallel conductive paths 48, moisture barrier 41 between adjacent particles 40 is displaced, such that the electrically conductive material of adjacent particles 40 comes into contact, allowing a conduction path to form between contact 4 and contact 8. However, moisture barrier 41 remains between each parallel conductive path 48 and binder 42, helping to reduce subsequent migration of the electrically conductive material of particles 40.

Figure 8:
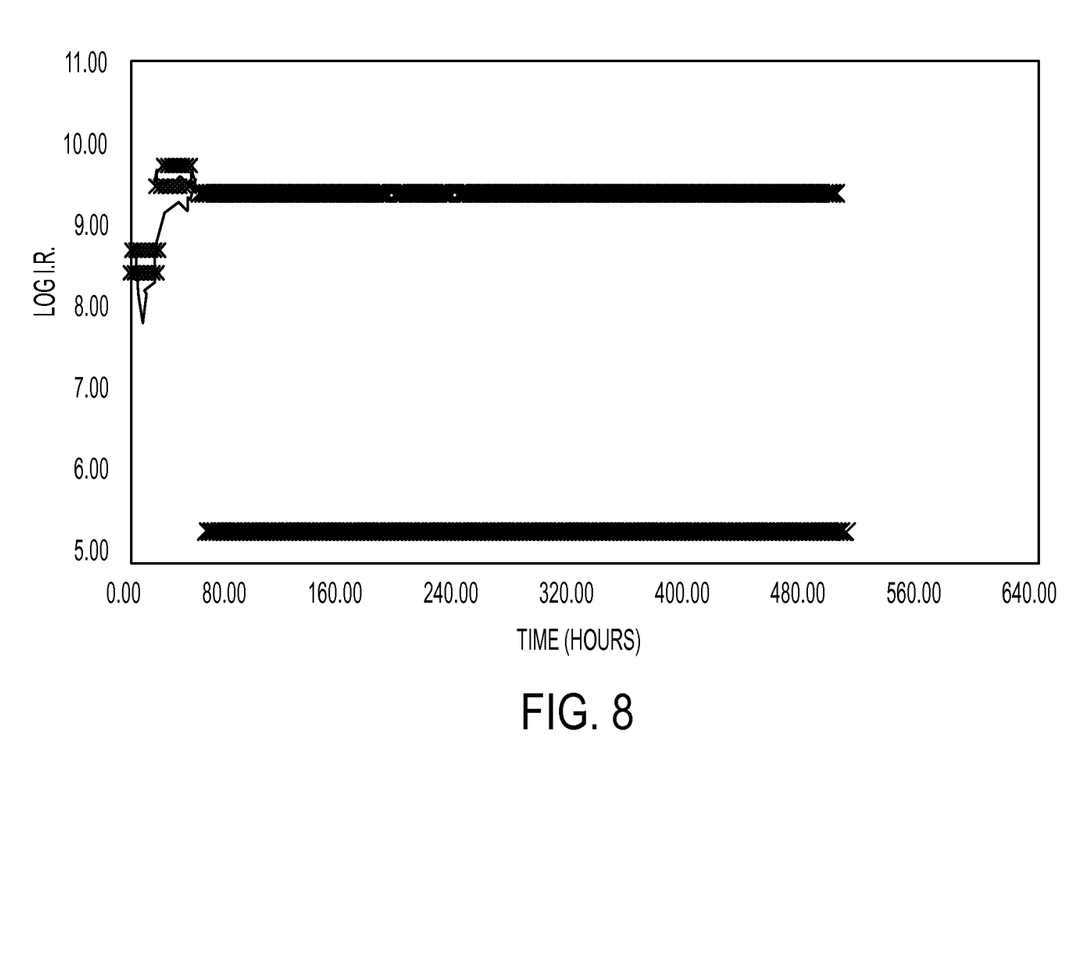
FIG. 8 is a plot of insulation resistance versus time for another illustrative embodiment of an ACA, showing reduced migration of the electrically conductive material of particles of the ACA (as compared to the ACA of FIG. 6).

An illustrative embodiment of ACA 10 including moisture barrier 41 (specifically, a 50:50 mix of phenolic novolak and furfural solvent) applied to particles 40 was tested. FIG. 8 illustrates a plot of insulation resistance (I.R.), at 50 V bias, for this ACA 10 over approximately 500 hours, where the ACA 10 was subjected to 80° C. and 80% relative humidity. As can be seen from FIG. 8, the insulation resistance of ACA 10 remains relatively constant over time, indicating that moisture barrier 41 has reduced migration of the electrically conductive material of particles 40 within ACA 10. It is believe that the presently disclosed moisture barrier 41 may reduce migration of the electrically conductive material of particles 40 within ACA 10 for up to 1000 hours (or more) at low voltage conditions.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure.

The invention claimed is:

1. An anisotropic conductive adhesive (ACA) comprising:
   a curable binder; and
   a plurality of particles suspended in the binder, each of the plurality of particles comprising a ferromagnetic material coated with a layer of electrically conductive material and with a moisture barrier, the electrically conductive material forming electrically conductive and isolated parallel paths when the ACA is subjected to a magnetic field, wherein the moisture barrier reduces migration of the electrically conductive material after the binder is cured, and wherein the moisture barrier comprises a carbon layer.

2. The ACA of claim 1, wherein the moisture barrier surrounds the layer of electrically conductive material on each of the plurality of particles prior to the ACA being subjected to the magnetic field.

3. The ACA of claim 2, wherein the moisture barrier surrounds each of the electrically conductive and isolated parallel paths after the binder is cured.

4. The ACA of claim 1, wherein the binder is curable by a heat treatment.

5. An anisotropic conductive adhesive (ACA) comprising:
   a curable binder; and
   a plurality of particles suspended in the binder, each of the plurality of particles comprising a ferromagnetic material coated with a layer of electrically conductive material and with a moisture barrier that reduces migration of the electrically conductive material after the binder is cured, the electrically conductive material forming electrically conductive and isolated parallel paths when the ACA is subjected to a magnetic field, wherein the moisture barrier comprises a solution of phenolic novolac in furfural solvent.

6. The ACA of claim 5, wherein the solution comprises between 30-70% phenolic novolac by weight and between 30-70% furfural solvent by weight.

7. The ACA of claim 5, wherein the solution comprises equal parts by weight of the phenolic novolac and the furfural solvent.

8. The ACA of claim 1, wherein the electrically conductive material comprises a noble metal.

9. The ACA of claim 1, wherein the ferromagnetic material of each of the plurality of particles comprises a solid sphere.

10. The ACA of claim 1, wherein each of the plurality of particles further comprises a core formed from at least one of carbon, graphite, glass, and mica, the core being coated with the ferromagnetic material.

11. The ACA of claim 1, wherein an average maximum dimension of the plurality of particles is between 1 µm and 25 µm.

12. The ACA of claim 11, wherein the average maximum dimension is less than 1 µm.

13. The ACA of claim 1, wherein the binder comprises a catalyst and a compound comprising a dimer fatty acid diglycidyl ester and an oxirane.

14. A method comprising:
   coating each of a plurality of particles including a ferromagnetic material with a layer of electrically conductive material;
   applying a chemical modifier to the plurality of particles to form a moisture barrier around the layer of electrically conductive material of each of the plurality of particles; and
   dispersing the plurality of particles in a curable binder to form an anisotropic conductive adhesive (ACA);
   wherein the moisture barrier reduces migration of the electrically conductive material after the binder is cured and wherein the moisture barrier comprises either (i) a carbon layer or (ii) phenolic novolac and furfural.

15. The method of claim 14, further comprising:
   subjecting the ACA to a magnetic field, such that the electrically conductive material forms electrically conductive and isolated parallel paths, and
   curing the binder.

16. The method of claim 14, wherein applying the chemical modifier to the plurality of particles comprises applying a solution of phenolic novolac in furfural solvent to the plurality of particles.

17. The method of claim 14, wherein an average maximum dimension of the plurality of particles is between 1 μm and 25 μm.

18. The ACA of claim 1, wherein insulation resistance of the ACA remains constant when the ACA is subjected to 80° C. and 80% relative humidity over 500 hours after the binder is cured.

19. An anisotropic conductive adhesive (ACA) comprising:
- a curable binder; and
- a plurality of particles suspended in the binder, each of the plurality of particles comprising a ferromagnetic material coated with a layer of electrically conductive material and further coated with a layer of phenolic novolac and furfural.

* * * * *